United States Patent
Klein et al.

(10) Patent No.: US 7,276,901 B2
(45) Date of Patent: Oct. 2, 2007

(54) METHOD FOR SHUNT DETECTION IN SENSORS

(75) Inventors: Christian Klein, Oberriexingen (DE); Tobias Ernst, Waiblingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/191,839

(22) Filed: Jul. 28, 2005

(65) Prior Publication Data

US 2006/0036381 A1    Feb. 16, 2006

(30) Foreign Application Priority Data

Aug. 10, 2004 (DE) .................. 10 2004 038 736

(51) Int. Cl.
G01R 19/00 (2006.01)

(52) U.S. Cl. .................. 324/252; 340/870.28; 324/771; 324/537; 702/64

(58) Field of Classification Search .................. 702/64; 363/23, 41, 54; 323/226, 223; 340/870.28; 324/252

See application file for complete search history.

(56) References Cited

U.S. PATENT DOCUMENTS

| | | | | |
|---|---|---|---|---|
| 3,660,750 A * | 5/1972 | Businelli | ...................... | 363/23 |
| 5,260,644 A * | 11/1993 | Curtis | ......................... | 323/226 |
| 6,208,175 B1 * | 3/2001 | Zydek et al. | .................. | 327/75 |
| 6,317,056 B1 * | 11/2001 | Klumpp et al. | ......... | 340/870.28 |
| 6,756,782 B2 * | 6/2004 | Van Zon | ..................... | 324/252 |

\* cited by examiner

*Primary Examiner*—John Barlow
*Assistant Examiner*—Hien Vo
(74) *Attorney, Agent, or Firm*—Michael J. Striker

(57) ABSTRACT

For monitoring a sensor using differential voltage evaluation for detecting a short circuit to ground and/or to supply voltage $U_B$, a first resistor and a second resistor $R_1$, $R_2$ are assigned to the sensor, a sum voltage is determined from voltages $U_P$, $U_M$ at terminals of the sensor, the sum voltage is compared to supply voltage $U_B$, a ratio a of determined sum voltage to supply voltage $U_B$ is then calculated, and depending on the value for the ratio a, the occurrence of a shunt at the positive terminal and/or negative terminal of the sensor is detected.

9 Claims, 3 Drawing Sheets

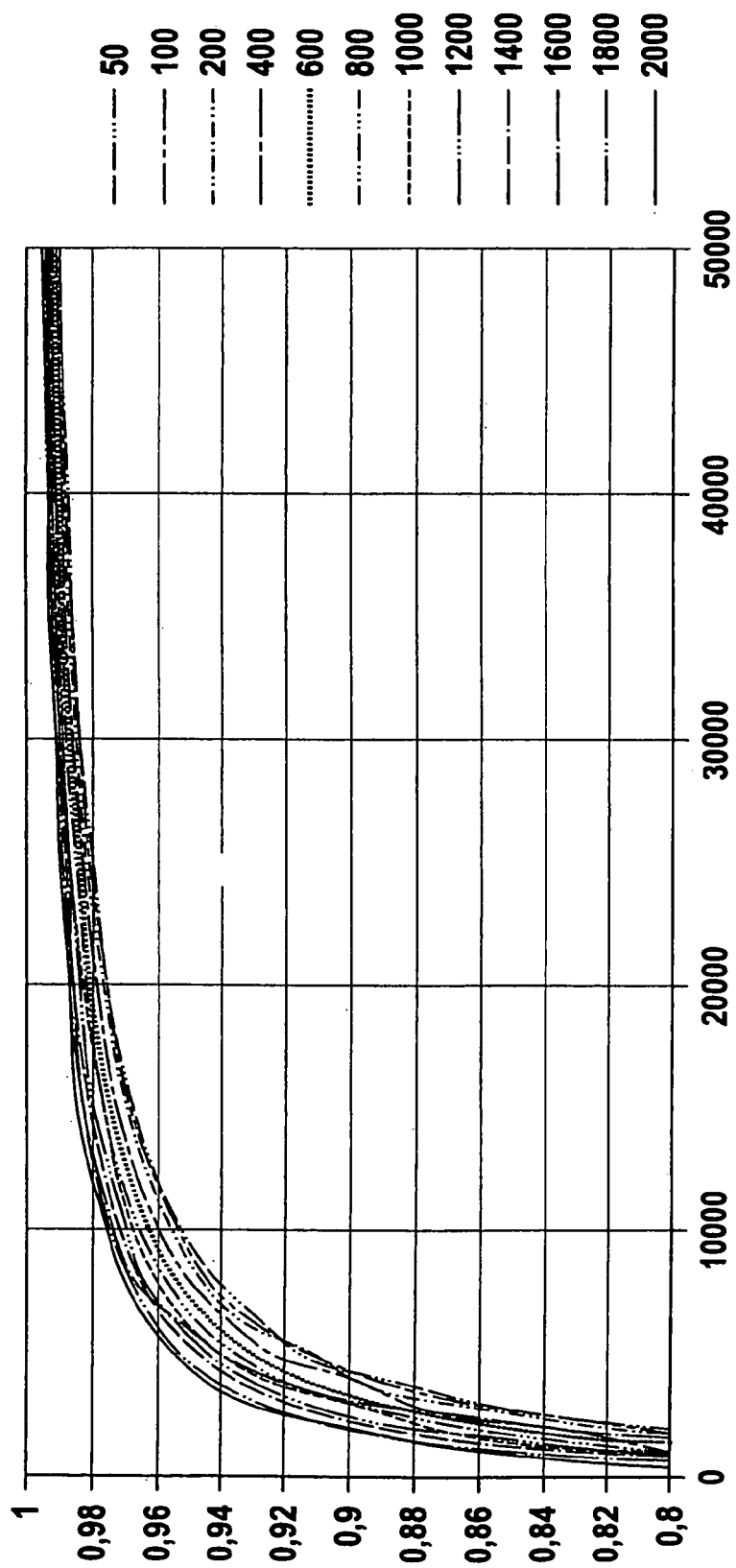

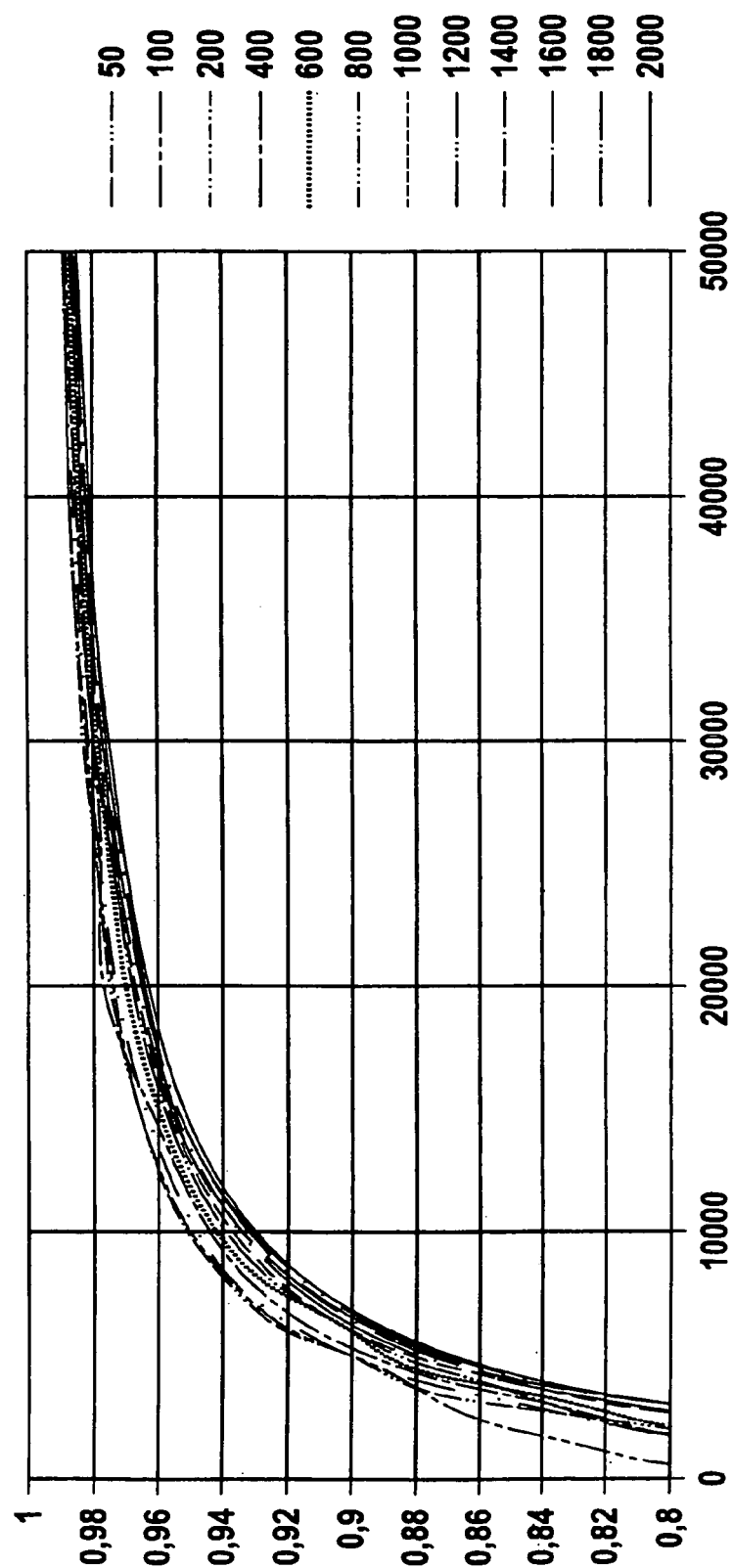

METHOD FOR SHUNT DETECTION IN SENSORS

BACKGROUND OF THE INVENTION

The present invention relates to a method for shunt detection in sensors.

Resistance-dependent semiconductor components (PTC elements) are used to record temperature values, which are evaluated via an analog input of a microprocessor. To increase accuracy, a difference evaluation is carried out, by way of which interfering ground effects can be eliminated. The temperature is required internally in the control devices to enable calculations to be carried out in the control device.

The method for performing a differential voltage evaluation is very widespread, in the automotive industry in particular, for use in the evaluation and determination of engine and transmission temperatures.

To prevent faulty temperature readings by temperature sensors, the operating method of temperature sensors is monitored. If temperatures are recorded in a faulty manner, erroneous calculations are carried out in control devices and incorrect characteristic curves are used. Generally speaking, a differential evaluation is carried out to detect a short circuit to ground, to $U_B$ and an interruption. It has not been possible to detect shunts with methods used so far to monitor sensors. Shunts result in alterated differential voltage and, therefore, to a faulty temperature reading. As such, it is not sufficient to merely monitor temperature sensors for short circuit to ground, to $U_B$, and detection of an interruption.

SUMMARY OF THE INVENTION

Accordingly, it is an object of the present invention to provide a method for shunt detection in sensors, which eliminates the disadvantages of the prior art.

In keeping with these objects and with others which will become apparent hereinafter, one feature of the present invention resides, briefly stated, in a method for monitoring a sensor using differential voltage evaluation for detecting a short circuit to ground and/or to supply voltage $U_B$, comprising the steps of assigning a first resistor $R_1$ and a second resistor $R_2$ to the sensor; determining a sum voltage based on voltages $U_P$, $U_M$ at terminals of the sensor; comparing said sum voltage to the supply voltage $U_B$; calculating a ratio a of the determined sum voltage to the supply voltage $U_B$; and depending on a value for the ratio a, detecting an occurrence of a shunt at the sensor.

With the solution proposed according to the present invention, a shunt is detected at a sensor, e.g., a temperature sensor, by calculating the voltage values at the sensor. When the resistances at the positive and negative terminals of the sensor are the same, the sum of the voltage at the sensor is equal to the supply voltage. A ratio a of the sum voltage to supply voltage is therefore equal to 1, provided that $R_1$ and $R_2$ are the same.

This circumstance provides an opportunity for diagnostics to be improved, namely the diagnostics of shunt resistances in particular. The following tolerance intervals, for example, for the value of ratio a are practical choices for use in a diagnosis evaluation: As long as the value for a fluctuates between 0.95 and 1.05, a shunt is not present. A shunt error is detected as soon as the ratio a falls below 0.95 or exceeds 1.05, for example. Instead of the values of 0.95 and 1.05 for ratio a stated here as an example, values such as 0.9 and 1.1, respectively, can be selected, for instance; this depends on the accuracy requirement placed on a temperature sensor, for example. Depending on the requirements and specifications on the accuracy of the temperature reading, ratio a can be specified in a defined manner as a function of resistances $R_1$ and $R_2$.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 2 shows the course of ratio a when a shunt is present with resistance $R_M$, FIG. 3 shows ratio a when a shunt is present with resistance $R_P$, Table I is a table of values for ratios a that occur when a shunt is present with resistance $R_M$ according to the depiction in FIG. 2, and Table II shows the course of ratio a when a shunt is present with resistance $R_P$, with a table of values.

DESCRIPTION OF THE PREFERRED EMBODIMENTS

Figure 1:
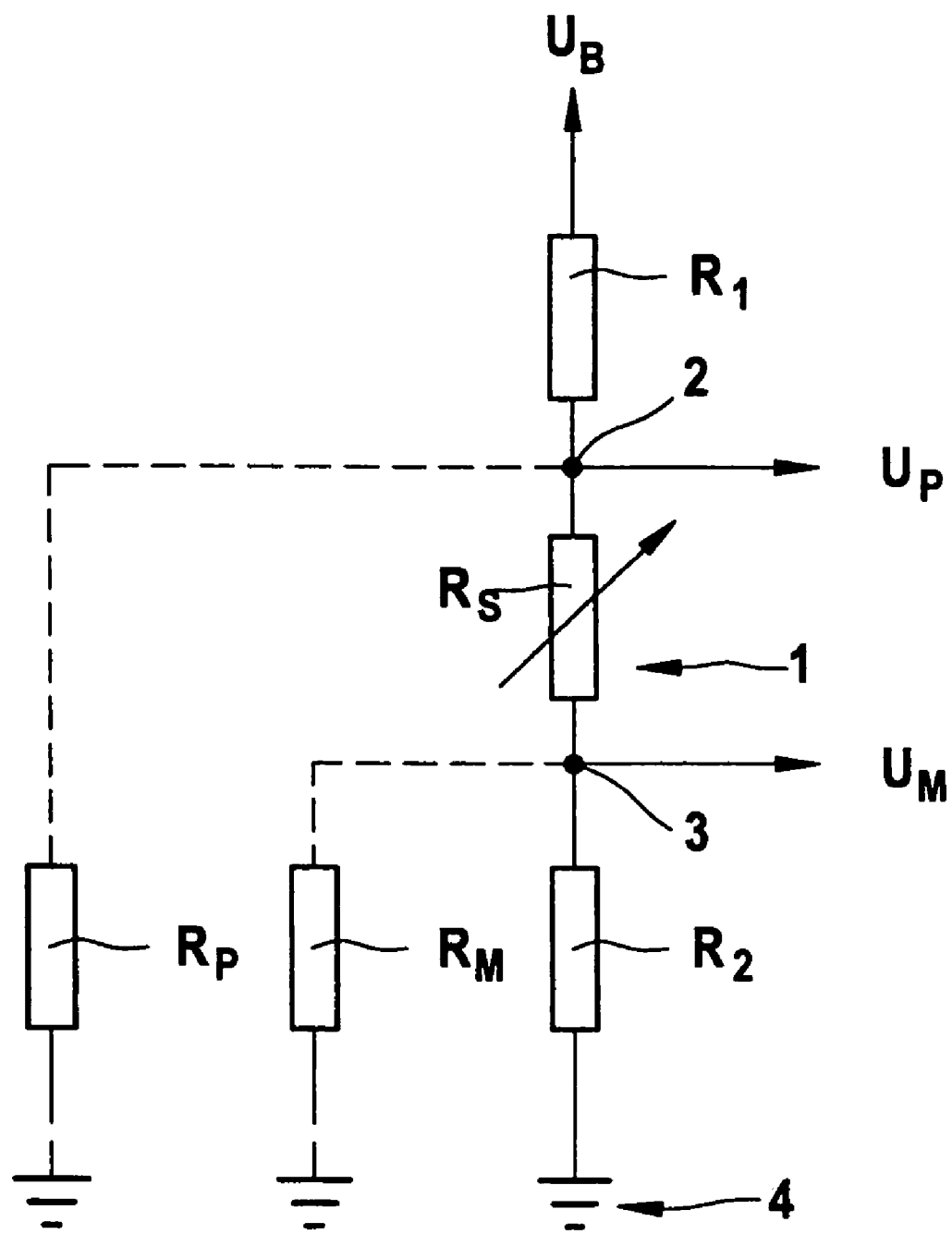
FIG. 1 shows a schematic depiction of the sensor circuitry with resistors $R_1$ and $R_2$ assigned to said sensor.

The illustration shown in FIG. 1 is a schematic depiction of a sensor arrangement connected to a supply voltage source and two resistors $R_1$ and $R_2$.

A sensor 1, indicated in FIG. 1 as a variable sensor resistor $R_s$, is connected to a supply voltage source, indicated as supply voltage $U_B$, and is also connected to ground 4. A resistor $R_2$ is connected upstream of sensor 1, resistor $R_2$ being connected between ground 4 and a negative terminal 3 of the sensor. In addition, a first resistor $R_1$ is connected downstream of sensor 2, said first resistor $R_1$ being connected between a positive terminal 2 and supply voltage $U_P$.

A shunt at positive terminal 2 is symbolized by shunt resistance $R_M$, which is also connected to ground 4; a shunt at negative terminal 3 of sensor 1 is indicated by shunt resistance $R_M$ at the negative terminal, and shunt resistance $R_M$ is also connected to ground 4. Shunt resistances $R_M$ and $R_P$ are understood herein below to mean effective resistances, said shunt resistances being caused, e.g, by a conductive contamination at the sensor or leakage currents at a defective sensor cable. In the calculations shown below, $R_M$ and $R_P$ are considered to be real ohmic resistance. The values of resistances $R_M$ and $R_P$ are not known. $U_P$, $U_M$ and $U_B$ are measured in the entire system, and the results are used to calculate ratio a. The value of ratio a is then compared with defined limits.

The following different cases can occur, based on FIG. 1:

Case 1 (no shunt resistance present):

In this case, voltage $U_M$ is present at negative terminal 3, said voltage being defined by the following relationship:

$$U_M = U_B \frac{R_2}{(R_S + R_1 + R_2)} \qquad [1]$$

and, voltage $U_P$ is present at positive terminal 2 of sensor 1, said voltage $U_P$ being defined by the following relationship:

$$U_P = U_B \frac{R_2 + R_S}{(R_S + R_1 + R_2)} \quad [2]$$

Ratio a of the sum voltage to supply voltage is defined by:

$$a = \frac{U_P + U_M}{U_B} \quad [3]$$

When [1] and [2] are substituted in [3], ratio a is defined by:

$$a = \frac{(R_2 + R_S) + R_2}{R_S + R_1 + R_2} = \frac{2R_2 + R_S}{R_S + R_1 + R_2}$$

When $R_1 = R_2 = R$, ratio a is always =1.

Case 2 (with Shunt Resistance $R_M$ at Negative Terminal 3):

For simplicity, it is assumed that:

$$R_X = R_2 \square R_M = \frac{R_2 R_M}{R_2 + R_M}$$

Ratio a is obtained, based on the equation above, as follows:

$$a = \frac{2R_X + R_S}{R_S + R_1 + R_X}$$

Therefore:

$$a = \frac{2R_2 R_M + R_S(R_2 + R_M)}{R_1(R_2 + R_M) + R_S(R_2 + R_M) + R_2 R_M}$$

$$= \frac{R_M(2R_2 + R_S) + R_S R_2}{R_M(R_1 + R_2 + R_S) + R_2(R_1 + R_S)}$$

If $R_1 = R_2 = R$, ratio a is equal to:

$$a = \frac{R_M(2R + R_S) + R R_S}{R_M(2R + R_S) + R(R + R_S)}$$

For the case in which $R_M = \infty$, ratio a is equal to 1.

Case 3 (with Shunt Resistance $R_P$ at Positive Terminal 2)

In this case, in which shunt resistance $R_P$ is present at positive terminal 2 of sensor 1 according to the illustration in FIG. 1, the following applies:

$$U_P = U_B \frac{\frac{R_P(R_2 + R_S)}{R_P + R_2 + R_S}}{\frac{R_P(R_2 + R_S)}{R_P + R_2 + R_S} + R}$$

As a result, $U_P$, i.e. voltage $U_P$ present at positive terminal 2, is defined as:

$$U_P = U_B \frac{R_P(R_2 + R_S)}{R_P(R_2 + R_S) + R_1(R_P + R_2 + R_S)} \quad [1]$$

Voltage $U_M$ present at negative terminal 3 is defined as:

$$U_M = U_P \frac{R_2}{R_2 + R_S} \quad [2]$$

Ratio a of sum voltage to supply voltage is defined as follows:

$$a = \frac{U_P + U_P \frac{R_2}{R_2 + R_S}}{U_B} = \frac{U_P \left(\left(1 + \frac{R_2}{R_2 + R_S}\right)\right)}{U_B}$$

Based on equation [1], ratio a is defined as follows:

$$a = \frac{R_P(2R_2 + R_S)}{R_1(R_P + R_2 + R_S) + R_P(R_2 + R_S)} =$$

For the case in which first resistance $R_1$ is equal to second resistance $R_2$, the following applies:

$$R_1 = R_2 = R:$$

Ratio a of sum voltage to supply voltage is therefore defined as follows:

$$a = \frac{R_P(2R + R_S)}{R_P(2R + R_S) + R(R + R_S)}$$

For the case in which $R_P$ has the value $\infty$, ratio a of sum voltage to supply voltage is equal to 1.

If the shunt resistances, i.e, $R_M$ and $R_P$, are connected to supply voltage $U_P$, the relationships become reversed, so that values >1 result for ratio a. The values indicated below are practical choices for use in performing a diagnosis evaluation; these values are selected as examples only, however:

For the case in which the value of ratio a is $\leq 1.05$ but $\geq 0.95$, i.e, $0.95 \leq a \leq 1.05$, the diagnosis is "no shunt".

If the value of ratio a is less than 0.95 or greater than 1.05, the diagnosis is that a shunt error has occurred, i.e, a<0.95 or a>1.05.

In the illustration shown in FIG. 2, ratio a with a shunt having shunt resistance $R_M$ is plotted against various values for shunt resistance $R_M$. The various curve traces are plotted for a variable sensor resistance of 50, 100, 200, 400, 600, 800, 1000, 1200, 1400, 1600, 1800 and 2 kOhm. The values for first resistance $R_1$ and second resistance $R_2$ are both 1 kOhm.

The values that occur in this case are listed in Table I. The individual values for sensor resistance $R_S$ of 50 Ohm to 2 kOhm are listed in the first row of the table of values. The values for shunt resistance $R_M$ of 0 to 50000 are listed in the column to the far left.

In the illustration in FIG. 3, the course of ratio a with a shunt having shunt resistance $R_P$ at positive terminal 2 of sensor 1 is shown. In the case depicted in FIG. 3, sensor resistance $R_S$ has values 50 Ohm, 100 Ohm, 200 Ohm, 400 Ohm, 600

Ohm, 800 Ohm, 1000 Ohm, 1200 Ohm, 1400 Ohm, 1600 Ohm, 1800 Ohm, and 2 kOhm, and ratio a is between 0.8 and 1. The values for first resistance $R_1$ and second resistance $R_2$ are also each equal to 1 kOhm in the curve traces shown in FIG. 3.

The values of ratio a that occurs with a shunt having resistance $R_P$ at positive terminal 2 that belong to FIG. 3 are shown in Table II. As with Table I, the changing shunt resistance $R_P$ from 0 to 50000 Ohm is listed in the column to the far left, and variable sensor resistances $R_S$ of 50, 100, 200, 400, 600, 800 Ohm, 1 kOhm, 1.2 kOhm, 1.4 kOhm, 1.6 kOhm, 1.8 kOhm and 2 kOhm are listed in the top row in Table II. The course of ratio a with a shunt having shunt resistance $R_P$ at positive terminal 2 is based on the values in Table II. It becomes clear that, similar to the depiction according to FIGS. 2, 3, the curve traces that occur for ratio a with a shunt resistance $R_M$ and with a shunt resistance $R_P$—which are selected to be between 0 and 50 kOhm—result in a large number of curve traces. All of them have a steep slope that transitions into an asymptotic course approaching 1.

Values for ratio a for which a sensor evaluation should be carried out are between 0.95 and 1.05, as mentioned above. In other words, they lie in a range in which shunt resistance $R_M$ and shunt resistance $R_P$ are $\geq 10$ kOhm.

The exact limits of a at which a sensor evaluation must still take place depend on the accuracy requirements placed on the overall system. If values for a are outside this defined range, the influence of the shunt resistance on the overall system is so great that it no longer makes sense to perform the sensor evaluation and, if necessary, a sensor replacement value can be utilized instead. In this case, the sensor diagnosis detects a shunt error.

TABLE I

| | Variable Sensor Resistance $R_s$ | | | | | | |
|---|---|---|---|---|---|---|---|
| Shunt | 50 | 100 | 200 | 400 | 600 | 800 | 1000 |
| 50000 | 0.99034283 | 0.99057493 | 0.99100719 | 0.99176277 | 0.99240122 | 0.99294781 | 0.99342105 |
| 45000 | 0.98928189 | 0.98963975 | 0.99001996 | 0.99085923 | 0.9915683 | 0.99217527 | 0.99270073 |
| 40000 | 0.98796906 | 0.98824912 | 0.98878924 | 0.98973306 | 0.9905303 | 0.99121265 | 0.99180328 |
| 35000 | 0.98626374 | 0.98659517 | 0.98721228 | 0.9882904 | 0.98920086 | 0.98997996 | 0.99065421 |
| 30000 | 0.98401279 | 0.98439938 | 0.98511905 | 0.98637602 | 0.98743719 | 0.98834499 | 0.98913043 |
| 25000 | 0.98087954 | 0.98134328 | 0.98220641 | 0.98371336 | 0.98498498 | 0.98607242 | 0.98701299 |
| 20000 | 0.97621879 | 0.97679814 | 0.97787611 | 0.9795709 | 0.98134328 | 0.98269896 | 0.98387097 |
| 15000 | 0.96855346 | 0.96932515 | 0.97076023 | 0.97326203 | 0.97536946 | 0.97716895 | 0.97787234 |
| 10000 | 0.96359629 | 0.95475113 | 0.95689655 | 0.96062992 | 0.96376812 | 0.96664495 | 0.96875 |
| 8000 | 0.94269341 | 0.94413408 | 0.94680851 | 0.95145631 | 0.95535714 | 0.95867769 | 0.96153846 |
| 6000 | 0.92509363 | 0.9270073 | 0.93055556 | 0.93670886 | 0.94186047 | 0.94623656 | 0.95 |
| 5000 | 0.91150442 | 0.9137931 | 0.91803279 | 0.92537313 | 0.93150685 | 0.93670886 | 0.94117647 |
| 4000 | 0.89189189 | 0.89473684 | 0.9 | 0.90909091 | 0.91666667 | 0.92307692 | 0.92857143 |
| 3000 | 0.86111111 | 0.86486486 | 0.87179487 | 0.88372093 | 0.89361702 | 0.90196078 | 0.90909091 |
| 2000 | 0.80582524 | 0.81132075 | 0.82142857 | 0.83870968 | 0.85294118 | 0.86486486 | 0.875 |
| 1000 | 0.67741935 | 0.6875 | 0.70588235 | 0.73684211 | 0.76190476 | 0.7826087 | 0.8 |
| 0 | 0.04761905 | 0.09090909 | 0.1666667 | 0.28571429 | 0.375 | 0.44444444 | 0.5 |

| Shunt | 1200 | 1400 | 1600 | 1800 | 2000 |
|---|---|---|---|---|---|
| 50000 | 0.99318477 | 0.99419954 | 0.99452355 | 0.99481328 | 0.99507389 |
| 45000 | 0.99316005 | 0.99356499 | 0.99392467 | 0.99424626 | 0.99453552 |
| 40000 | 0.99231951 | 0.99277457 | 0.99317872 | 0.99354005 | 0.99386503 |
| 35000 | 0.99124343 | 0.99176277 | 0.99222395 | 0.99263623 | 0.99300699 |
| 30000 | 0.9898167 | 0.99042146 | 0.99095841 | 0.99143836 | 0.99186992 |
| 25000 | 0.98783455 | 0.98855835 | 0.98920066 | 0.98777505 | 0.99029126 |
| 20000 | 0.9848926 | 0.98579545 | 0.98659517 | 0.98730964 | 0.98795181 |
| 15000 | 0.98007968 | 0.98127341 | 0.98233216 | 0.98327759 | 0.98412698 |
| 10000 | 0.97076023 | 0.97252747 | 0.97409326 | 0.9754902 | 0.97674419 |
| 8000 | 0.96402878 | 0.96621622 | 0.96815287 | 0.96987952 | 0.97142857 |
| 6000 | 0.95327103 | 0.95614035 | 0.95867769 | 0.9609375 | 0.96296296 |
| 5000 | 0.94505495 | 0.94845361 | 0.95145631 | 0.95412844 | 0.95652174 |
| 4000 | 0.93333333 | 0.9375 | 0.94117647 | 0.94444444 | 0.94736842 |
| 3000 | 0.91525424 | 0.92063492 | 0.92537313 | 0.92957746 | 0.93333333 |
| 2000 | 0.88372093 | 0.89130435 | 0.89795918 | 0.90384615 | 0.90909091 |
| 1000 | 0.81481481 | 0.82758621 | 0.83870968 | 0.84848485 | 0.85714286 |
| 0 | 0.54545455 | 0.58333333 | 0.61538462 | 0.64285714 | 0.66666667 |

TABLE II

| | Variable Sensor Resistance $R_s$ | | | | | | |
|---|---|---|---|---|---|---|---|
| Shunt resistance | 50 | 100 | 200 | 400 | 600 | 800 | 1000 |
| 50000 | 0.98985997 | 0.98963242 | 0.98920863 | 0.98846787 | 0.98784195 | 0.98730606 | 0.98684211 |
| 45000 | 0.98874598 | 0.98849372 | 0.98802395 | 0.98720293 | 0.98650927 | 0.9591549 | 0.98540146 |
| 40000 | 0.98735701 | 0.98707403 | 0.98654709 | 0.98562628 | 0.98484848 | 0.98418278 | 0.98360656 |
| 35000 | 0.98557692 | 0.98625469 | 0.98465473 | 0.98360656 | 0.98272138 | 0.98196393 | 0.98130841 |
| 30000 | 0.98321343 | 0.98283931 | 0.98214286 | 0.98092643 | 0.9798995 | 0.97902098 | 0.97826087 |

TABLE II-continued

Variable Sensor Resistance $R_s$

| | | | | | | | |
|---|---|---|---|---|---|---|---|
| 25000 | 0.97992352 | 0.97947761 | 0.97864769 | 0.9771987 | 0.97597598 | 0.97493036 | 0.97402597 |
| 20000 | 0.97502973 | 0.97447796 | 0.97345133 | 0.97165992 | 0.97014925 | 0.96885813 | 0.96774194 |
| 15000 | 0.96698113 | 0.96625767 | 0.96491228 | 0.96256684 | 0.96059113 | 0.95890411 | 0.95744681 |
| 10000 | 0.9512761 | 0.95022624 | 0.94827586 | 0.94488189 | 0.94202899 | 0.93959732 | 0.9375 |
| 8000 | 0.93982808 | 0.93854749 | 0.93617021 | 0.93203883 | 0.92857143 | 0.92561983 | 0.92307692 |
| 6000 | 0.92134831 | 0.91970803 | 0.91666667 | 0.91139241 | 0.90697674 | 0.90322581 | 0.9 |
| 5000 | 0.90707965 | 0.90517241 | 0.90163934 | 0.89562239 | 0.89041096 | 0.88607595 | 0.88235294 |
| 4000 | 0.88648649 | 0.88421053 | 0.88 | 0.87282727 | 0.86666667 | 0.86153846 | 0.85714286 |
| 3000 | 0.85416667 | 0.85135135 | 0.84615385 | 0.8372093 | 0.82978723 | 0.82352941 | 0.81818182 |
| 2000 | 0.791165 | 0.79245283 | 0.78571429 | 0.77419355 | 0.76470588 | 0.75675676 | 0.75 |
| 1000 | 0.66129032 | 0.65625 | 0.64705882 | 0.63157895 | 0.61904762 | 0.60869565 | 0.6 |
| 0 | 0 | 0 | 0 | 0 | 0 | 0 | 0 |

| Shunt resistance | 1200 | 1400 | 1600 | 1800 | 2000 |
|---|---|---|---|---|---|
| 50000 | 0.986436498 | 0.98607889 | 0.98576123 | 0.98547718 | 0.98522167 |
| 45000 | 0.98495212 | 0.98455598 | 0.98420413 | 0.98388953 | 0.98360656 |
| 40000 | 0.983102919 | 0.98265896 | 0.98226467 | 0.98191244 | 0.9815909 |
| 35000 | 0.980735552 | 0.98023046 | 0.97978227 | 0.97938144 | 0.97902098 |
| 30000 | 0.977596741 | 0.97701149 | 0.97649186 | 0.9760274 | 0.97560976 |
| 25000 | 0.97323601 | 0.9725490S | 0.97192225 | 0.97137014 | 0.97087379 |
| 20000 | 0.966767372 | 0.96590909 | 0.96514745 | 0.96446701 | 0.96385542 |
| 15000 | 0.956175299 | 0.95505618 | 0.9540636 | 0.95317726 | 0.96238095 |
| 10000 | 0.935672515 | 0.93406593 | 0.93264249 | 0.93137255 | 0.93023256 |
| 8000 | 0.920863309 | 0.91891892 | 0.91719745 | 0.91566265 | 0.91428571 |
| 6000 | 0.897196262 | 0.89473684 | 0.89256198 | 0.890625 | 0.88888889 |
| 5000 | 0.879120879 | 0.87628866 | 0.87378641 | 0.87156963 | 0.86956622 |
| 4000 | 0.853333333 | 0.85 | 0.84705882 | 0.84444444 | 0.84210526 |
| 3000 | 0.813559322 | 0.80952381 | 0.80597015 | 0.8028169 | 0.8 |
| 2000 | 0.744186047 | 0.73913043 | 0.73469388 | 0.73076923 | 0.72727273 |
| 1000 | 0.592592593 | 0.5862069 | 0.58064516 | 0.57575758 | 0.57142867 |
| 0 | 0 | 0 | 0 | 0 | 0 |

What is claimed is:

1. A method for monitoring a sensor using differential voltage evaluation for detecting a short circuit to ground and/or to supply voltage $U_B$, comprising the steps of assigning a first resistor $R_1$ and a second resistor $R_2$ to the sensor; determining a sum voltage based on voltage $U_P$ at a first terminal of the sensor and a voltage $U_M$ at a second terminal of the sensor; comparing said sum voltage to the supply voltage $U_B$; calculating a ratio a of the determined sum voltage to the supply voltage $U_B$; depending on a value for the ratio a, detecting an occurrence of a shunt at the sensor; and evaluating an operation of the sensor based on the occurrence or non-occurrence of the shunt at the sensor.

2. A method as defined in claim 1; and further comprising selecting the ratio $$a = \frac{U_P + U_M}{U_B}$$

equals 1 when the values for the first resistance $R_1$, and the second resistance $R_2$, are the same.

3. A method as defined in claim 1; and further comprising determining an occurrence of a shunt at a negative terminal to ground at the sensor by a ratio a based on a relationship:

$$a = \frac{R_M(2R + R_S) + RR_S}{R_M(2R + R_S) + R(R + R_S)}$$

with $R_1 = R_2 = R$.

4. A method as recited in claim 1; and further comprising determining an occurrence of a shunt at a positive terminal to ground at the sensor by a ratio a based on a relationship:

$$a = \frac{R_P(2R + R_S)}{R_P(2R + R_S) + R(R + R_S)}$$

with $R_1 = R_2 = R$.

5. A method as defined in claim 3; and further comprising determining an occurrence of a shunt at the negative terminal to $U_B$ at the sensor by 1/a.

6. A method as recited in claim 4; and further comprising determining an occurrence of a shunt at the positive terminal to $U_B$ at the sensor by 1/a.

7. A method as defined in claim 1; and further comprising indicating by values of $0.95 \leq a \leq 1.05$ that a shunt is not present.

8. A method as defined in claim 1; and further comprising indicating by values of a<0.95 or a<1.05 that a shunt is present at a positive terminal or a negative terminal of the sensor.

9. A method for monitoring a sensor using differential voltage evaluation for detecting a short circuit to ground and/or to supply voltage, comprising the steps of assigning a first resistor and a second resistor to the sensor; determining a sum voltage based on a voltage at a first terminal of the sensor and a voltage at a second terminal of the sensor; comparing said sum voltage to the supply voltage; calculating a ratio of the determined sum voltage to the supply voltage; depending on a value for said ratio, detecting an occurrence of a shunt at the sensor; evaluating an operation of the sensor based on the occurrence or non-occurrence of the shunt at the sensor; determining limits of said ratio at which a sensor evaluation should not take place any more; and stopping performing the sensor evaluation if values for said ratio are outside of a range defined by said limits.

* * * * *